United States Patent [19]

Hirsch et al.

[11] Patent Number: 5,192,581
[45] Date of Patent: *Mar. 9, 1993

[54] PROTECTIVE LAYER FOR PREVENTING ELECTROLESS DEPOSITION ON A DIELECTRIC

[75] Inventors: Tom J. Hirsch, Austin; Charles W. C. Lin, San Antonio; Chung J. Lee; Heinrich G. O. Muller, both of Austin, all of Tex.

[73] Assignee: Microelectronics and Computer Technology Corporation, Austin, Tex.

[*] Notice: The portion of the term of this patent subsequent to Jan. 1, 2008 has been disclaimed.

[21] Appl. No.: 822,383

[22] Filed: Jan. 14, 1992

Related U.S. Application Data

[63] Continuation-in-part of Ser. No. 600,361, Oct. 19, 1990, Pat. No. 5,084,299, which is a continuation-in-part of Ser. No. 494,897, Mar. 3, 1990, Pat. No. 4,981,715, which is a continuation-in-part of Ser. No. 393,170, Aug. 10, 1989, abandoned.

[51] Int. Cl.⁵ .............. B05D 3/06; B05D 5/12; H01L 21/306
[52] U.S. Cl. .................... 427/556; 426/96; 426/98; 156/628; 156/646; 156/656
[58] Field of Search ............ 427/54.1, 53.1, 96, 427/98; 156/628, 654, 656, 646

[56] References Cited

U.S. PATENT DOCUMENTS

| | | | |
|---|---|---|---|
| 4,078,096 | 3/1978 | Redmond et al. | 427/98 |
| 4,112,139 | 9/1978 | Shirk et al. | 427/54 |
| 4,388,351 | 6/1983 | Sawyer | 427/304 |
| 4,472,513 | 9/1984 | Menger-Hammond et al. | 502/5 |
| 4,486,463 | 12/1984 | Rubner et al. | 427/53.1 |
| 4,517,254 | 5/1985 | Grapentin et al. | 428/626 |
| 4,519,876 | 5/1985 | Lee et al. | 204/15 |
| 4,574,095 | 3/1986 | Baum et al. | 427/53.1 |
| 4,643,798 | 2/1987 | Takada et al. | 156/630 |

(List continued on next page.)

OTHER PUBLICATIONS

Von Gutfeld et al, "Laser-Enhanced Plating and Etching: Mechanisms and Applications," IBM Journal of Research and Development, vol. 26, No. 2, pp. 136–144 (Mar., 1982).

Cole et al., "Laser-Activated Copper Deposition on Polyimide," Electrochemical Society Meeting, Symposium on Electronic Packaging, pp. A4–7 through A4–12 (Oct., 1987).

Cole et al., "Laser Processing For Interconnect Technology," Optoelectronics and Laser Applications in Science and Engineering, pp. A4–2 through A4–6 (Jan., 1988).

"Deposit Copper Films On Polyimide Using A Laser Catalysed Process," Semiconductor International, p. 16 (Nov., 1988).

Jackson, "Initiation of Electroless Copper Plating Using Pd(+2)/Poly(Acrylic Acid) Films," Journal of the Electrochemical Society, pp. 3172–3173 (Dec., 1988).

A. Auerbach, "Method for Reducing Metal Salts Complexed in a Polymer Host with a Laser," Journal of the

(List continued on next page.)

Primary Examiner—Marianne Padgett
Attorney, Agent, or Firm—David M. Sigmond

[57] ABSTRACT

A dielectric substrate is coated with a protective layer and a catalyst film is formed in a laser irradiated predetermined pattern on the protective layer so that during electroless deposition a metal is plated on the catalyst film in the predetermined pattern whether or not the dielectric has unwanted catalytic sites. The protective layer is not removed by the electroless plating bath or prior etch steps but can subsequently be stripped by a separate etch without removing the plated metal or the dielectric from the substrate.

48 Claims, 7 Drawing Sheets

U.S. PATENT DOCUMENTS

| | | | |
|---|---|---|---|
| 4,659,587 | 4/1987 | Imura et al. | 427/35 |
| 4,666,735 | 5/1987 | Hoover et al. | 427/43.1 |
| 4,670,306 | 6/1987 | Salem | 427/258 |
| 4,681,774 | 7/1987 | Halliwell et al. | 427/53.1 |
| 4,701,351 | 10/1987 | Jackson | 427/98 |
| 4,775,608 | 10/1988 | Baum et al. | 430/320 |
| 4,822,633 | 4/1989 | Inoue | 427/43.1 |
| 4,981,715 | 1/1991 | Hirsch et al. | 427/53.1 |

OTHER PUBLICATIONS

Electrochemical Society: Solid-State Science and Technology, vol. 132, No. 6, pp. 1437–1440 (Jun., 1985).

M. E. Gross et al, "Laser direct-write metallization in thin palladium acetate films," Journal of Applied Physics, vol. 61(4), pp. 1628–1632 (Feb. 15, 1987).

A. Gupta et al, "High-conductance customized copper interconnections produced by laser seeding and selective electrodeposition," Applied Physics Letters, vol. 56(25), pp. 2515–2518 (Jun. 18, 1990).

Hirsch et al., "Selective-area electroless copper plating on polyimide employing laser patterning on a catalytic film," Applied Letters Physics, vol. 57(13), Sep. 24, 1990, pp. 1357–1359.

"IP 650 LIFTIMIDE #1" by Cemota Inc., Jul. 1991, pp. 1–2.

"Lite-Mask Coating Preliminary Technical Data Sheet" by Loctite, May 1989, p. 1.

"Operating Instructions for PCK 570 (TM) Electroless Copper Bath" by the PCK Technology Division, Melville, N.Y., Jan. 1988, p. 1.

PROTECTIVE LAYER FOR PREVENTING ELECTROLESS DEPOSITION ON A DIELECTRIC

U.S. GOVERNMENT LICENSE RIGHTS

The U.S. Government has a paid-up license in this invention and the right in limited circumstances to require the patent owner to license others on reasonable terms as provided for by the terms of Contract No. J-FBI-89-103 awarded by the Defense Advanced Research Projects Agency (DARPA).

CROSS-REFERENCE TO RELATED APPLICATIONS

This is a continuation-in-part of U.S. application Ser. No. 07/600,361 filed Oct. 19, 1990 (U.S. Pat. No. 5,084,299); which is a continuation-in-part of U.S. application Ser. No. 07/494,897 filed Mar. 3, 1990 (U.S. Pat. No. 4,981,715); which is a continuation-in-part of U.S. application Ser. No. 07/393,170 filed Aug. 10, 1989 (abandoned).

BACKGROUND OF THE INVENTION

1. Field of The Invention

The present invention relates to selective electroless deposition of a metal on a substrate, and more particularly to applying a protective layer on the dielectric so that during electroless deposition the metal is plated only on a catalyst film laser-patterned in a predetermined pattern on the protective layer whether or not the dielectric is catalytic outside the predeterimined pattern.

2. Description of the Related Art

Laser assisted electroless plating has been discussed in the literature in which a laser beam is used to enhance the plating reactions by creating very localized heating. These methods generally suffer the drawback that the horizontal scan rate of the laser is constrained by the slow vertical electroless deposition rates. These slow vertical deposition rates are inherent in the physics of the process and are not likely to be increased substantially. This time delay may make direct laser writing of plated metal impractical when hundreds or thousands of interconnections must be formed on a substrate.

Another technique for patterning metal on a substrate is by laser assisted chemical vapor deposition of a palladium catalyst, as disclosed in U.S. Pat. No. 4,574,095 to Baum. This method, however, uses a temperature controlled vacuum system during laser writing which requires a much more complex and expensive process than wet chemistry.

It is also well known that a polymer film which does not initially contain palladium can be patterned, and palladium can be subsequently applied to the patterned film to form a catalyst for electroless plating, as described in U.S. Pat. No. 4,666,735 to Hoover and U.S. Pat. No. 4,701,351 to Jackson. In both of these methods, however, conventional photolithography techniques are used to pattern the polymer film; that is, a photoimagible polymer is exposed to light through a mask to create the desired pattern. In the case of Jackson this photoimagible polymer is separate from the polymer which complexes the palladium. Finally, in a paper by Cole et al. presented at the Electrochemical Society Meeting in October, 1987 a method is proposed in which palladium compounds are irradiated with a laser to selectively physically alter the palladium in such a way that only the irradiated areas are catalytic to electroless plating. The palladium acetate disclosed in Cole is not, however, a polymer with complexed palladium ions, but rather an organic metallic compound which is likely to have relatively low solubility in water and require an organic solvent to achieve satisfactory solubility. Such organic solvent is often chloroform, a carcinogen. In addition, the film must cover the entire substrate prior to laser writing and therefore most of the palladium, an expensive material, may be wasted since in some applications only a small percentage of the substrate area will ultimately contain metal features.

An improved technique for laser-patterned selective electroless plating is described by Hirsch et al. in U.S. Pat. No. 4,981,715 and U.S. application Ser. No. 07/600,361 filed Oct. 19, 1991 which are assigned to the assignee of the present invention and incorporated herein by reference. In one embodiment a substrate is coated with a solution of polymer-seed metal mixture which can initiate electroless plating, the mixture is dried and selectively irradiated in a predetermined pattern, the non-irradiated mixture is etched off, and the substrate is placed in an electroless bath which deposits metal on the substrate in the predetermined pattern. In another embodiment a substrate is immersed in a polymer solution, polymer is deposited where the substrate is irradiated in a predetermined pattern, the substrate is removed from the polymer solution, the deposited polymer is contacted with a solution of seed metal ions which can initiate electroless plating to form a complexed deposited polymer, and the substrate is placed in an electroless bath which deposits metal on the complexed deposited polymer in the predetermined pattern.

Nevertheless, Applicant has observed an electroless "sheeting" problem in which widespread deposition of metal occurs in unwanted catalytic areas on the dielectric (i.e., those not irradiated by the laser) during the electroless plating step. The ability of a polyimide surface to catalyze electroless metal may result inadvertently from various substrate fabrication processes. For instance, depositing metals on polyimide by either sputtering or evaporation may create a conductive carbonized surface film. Also, improper plasma etching can create an undesired surface film such as teflon. Polyimide modified to contain such films may become catalytic and initiate undesired electroless deposition. Furthermore, the observed sheeting problem has been random and difficult to predict in advance for a particular substrate.

Needless to say, there is a need for preventing unwanted electroless sheeting on a dielectric which has inadvertently become catalytic in certain regions.

SUMMARY

The present invention solves the electroless sheeting problem. In accordance with the present invention, a dielectric substrate is coated with a protective layer and a catalyst film is formed in a laser irradiated predetermined pattern on the protective layer so that during electroless deposition a metal is plated on the catalyst film in the predetermined pattern whether or not the layer is not removed by the electroless plating bath or prior etch steps but can subsequently be stripped by a separate etch without removing the plated metal or the dielectric from the substrate.

Accordingly, it is an object of the present invention to provide an improved method for fabricating laser patterned electroless metal plating on a substrate which may contain unwanted catalytic sites.

Another object of the present invention is a method of accurately laser patterning electroless metal to customize or repair existing metallization without photolithography and without being constrained by the slow vertical laser-assisted electroless deposition rates of the metal to be plated.

Yet another object of the present invention is a method of electrolessly plating interconnections between bond pads without inadvertently plating short circuits between other bond pads.

Still further object of the present invention is wherein a catalyst can be selectively deposited by irradiation of a substrate immersed in a solution containing a complexing polymer without seed metal ions such as palladium, and then contacting the deposited complexing polymer with seed metal ions in order to form a patterned catalyst film while making economic use of the seed metal.

Yet a still further object of the present invention is to provide a wet chemistry invention using steps which individually are well known in the art.

A feature of the present invention is a process for the selective deposition of a metal on a substrate which includes providing a dielectric substrate, coating the substrate with a protective layer, coating the protective layer with a catalyst film which can initiate electroless deposition, directing a laser beam at the substrate to irradiate the catalyst film in a predetermined pattern, placing the substrate in a wet chemical etch that etches the non-irradiated catalyst film without etching the irradiated catalyst film or the protective layer, removing the substrate from the wet chemical etch after all the non-irradiated catalyst film is removed from the substrate, placing the substrate in an electroless plating bath so that an electrically conductive metal is deposited on the irradiated catalyst film without depositing the metal on the protective layer or the dielectric and without removing the protective layer from the dielectric, and removing the substrate from the electroless plating bath wherein the only metal which adheres to the protective layer is formed in the predetermined pattern on the irradiated catalyst film.

Another feature of the present invention is a process for the selective deposition of a metal on a substrate which includes providing a dielectric substrate, coating the substrate with a protective layer, immersing the substrate in a solution of a complexing material which can complex with seed metal ions which can initiate electroless deposition, directing a laser beam at the protective layer in a predetermined pattern so that complexing material from the solution is deposited in the predetermined pattern on the irradiated protective layer, removing the substrate from the solution of complexing material and cleaning all non-deposited complexing material off the substrate so that the deposited complexing material on the protective layer forms the predetermined pattern, placing the substrate in a solution containing seed metal ions so that the deposited complexing material becomes a catalyst film which can initiate electroless deposition, removing the substrate from the solution containing seed metal ions and cleaning any residual solution containing seed metal ions off the substrate, placing the substrate in an electroless plating bath so that an electrically conductive metal is deposited on the catalyst film without depositing the metal on the protective layer or the dielectric and without removing the protective layer from the dielectric, and removing the substrate from the electroless plating bath wherein the only metal which adheres to the protective layer is formed in the predetermined pattern on the catalyst film.

A further feature of the present invention is using a protective layer of polymer such as polyimide which may become a permanent part of the substrate.

Still another feature of the present invention is forming the catalyst film by drying a solution containing a complexed polymer (selected from poly(acrylic acids) or polyacrylamids) and dissolved seed metal ions (selected from palladium, platinum, gold, rhodium or any mixture thereof) which can initiate electroless deposition of a metal (selected from copper, nickel or gold).

Another feature of the present invention includes stripping the protective layer from the substrate by dry or wet chemical etching without removing the metal or the dielectric from the substrate.

A further feature of the present invention is wherein the dielectric substrate comprises a pair of metal bonding pads extending above the top major surface of the dielectric, the predetermined pattern includes portions of the pads and catalyst film between the pads, the laser beam physically removes the protective layer and catalyst film off the portions of the pads to expose the portions of the pads, the wet chemical etch fails to etch the exposed portions of the pads, and the metal is deposited on the exposed portions of the pads as well as the irradiated catalyst to form an electrical link between the pads. Preferably, the laser is a stationary beam and the predetermined path includes a continuous path between the exposed portions of the pads. If the protective layer becomes a permanent part of the substrate, a second laser beam can remove the protective layer from second portions of the irradiated pads and remove the protective layer from the non-irradiated pads to allow subsequent bonding operations.

A still further feature of the present invention is wherein gold is immersion coated on copper plated gold pads to enhance bonding operations such as wire bonding or tape-automated-bonding (TAB).

An advantage of the present invention is the ability to avoid exposing the catalyst film and/or complexing polymer to the temperatures required to apply the protective layer since such temperatures might burn or otherwise chemically change a catalyst film and/or complexing material. For instance, a 250° C. cure for a polyimide protective layer may render a catalyst film containing poly(acrylic acids) difficult to etch from the substrate after laser patterning.

Another advantage of the present invention is the strong adhesion between the protective layer and the substrate since there is no intermediary catalyst film therebetween.

A still further advantage of the present invention is that prior to electroless deposition the protective layer above protruding metal features can be physically removed by the laser heating instead of chemically removed in a subsequent etch step as is conventional with photoresist.

A still further advantage of the present invention is that the protective layer prevents the catalyst film and plating bath from attacking underlying metal features on the substrate.

These and other objects, features and advantages of the present invention will be more readily apparent from a review of the detailed description and preferred embodiments which follow.

BRIEF DESCRIPTION OF THE DRAWINGS

The following detailed description of the preferred embodiments can be best understood when read in conjunction with the following drawings, wherein.

DETAILED DESCRIPTION OF THE PREFERRED EMBODIMENTS

Referring now to the drawings wherein depicted elements are not necessarily drawn to scale and wherein like or similar elements are designated by the same reference numeral through the several views, and more particularly to FIGS. 1A–1K, there are shown successive cross-sectional views of fabricating a substrate generally designated 10 according to a first embodiment of the present invention.

Figure 1A:
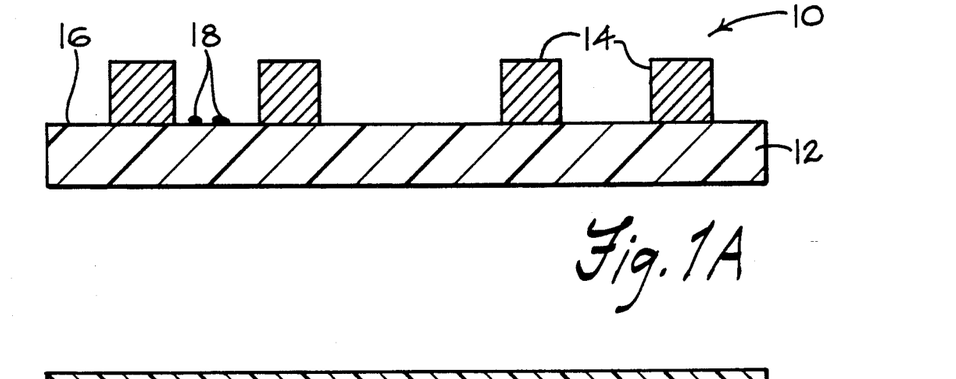
FIGS. 1A, 1B, 1C, 1D, 1E, 1F, 1G, 1H, 1I, 1J and 1K are successive cross-sectional views of one embodiment of using a protective layer to prevent unwanted electroless deposition on a dielectric.

With reference now to FIG. 1A, for illustration purposes only substrate 10 described herein is a high density copper/polyimide electrical interconnect with orthogonal layers of copper lines (not shown) fabricated on and/or embedded in a polyimide dielectric 12 which may rest on a silicon base (not shown). The copper lines may be fabricated by applying a 0.07 micron adhesion layer of chrome over the polyimide, a 5 micron pattern-electroplated copper layer over the chrome, and a 1 micron layer of nickel over the copper to prevent corrosion. The copper lines can terminate at bonding pads 14 which extend above the top major dielectric surface 16. Pads 14 are shown as gold bumps 5 microns high, 15 microns wide, and spaced 20 microns apart. Pads 14 provide electrical interconnection sites for integrated circuit chips (not shown). The chips can be surface mounted on surface 16 and connected to pads 14 by wire bonding or tape-automated-bonding (TAB) techniques. Also seen on surface 16 are unwanted catalytic sites 18 as previously discussed. In performing the method of the present invention, preferably the top surface 16 will initially be clean to ensure good adhesion of the plated metal to substrate 10. One such cleaning technique, for example, consists of exposing substrate 10 to an argon plasma in a vacuum chamber for 2.5 kW-minutes.

Figure 1B:
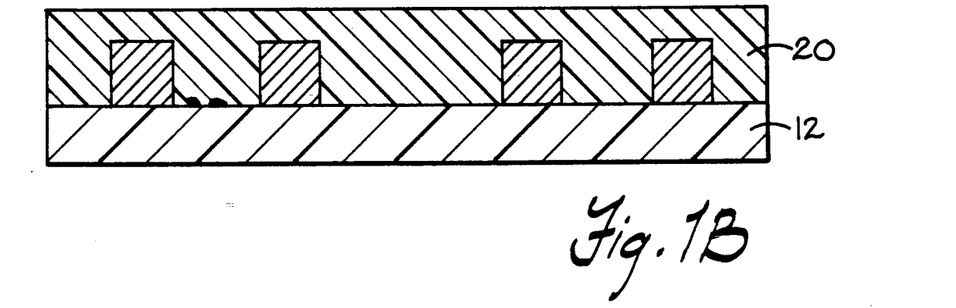

Referring now to FIG. 1B, substrate 10 is coated with a protective layer 20. Preferably, a solution containing the protective layer material is deposited on substrate 10 by a conventional technique like spraying, dipping or spinning and then the solution is dried or cured to form a solidified protective layer 20. Protective layer 20 need not necessarily be applied as a solution but it is most convenient to do so. For instance, a pre-imidized, soluble polyimide can be hardened without being cured. Suitable materials for protective layer 20 include polymers such as 1–3 microns thick polyimide. A particularly preferred protective layer 20 is approximately 1–2 microns thick (applied in two separate layers) of IP 650 Liftimide as described in "IP 650 LIFTIMIDE #1" by Cemota, Inc., 07/91, pp. 1–2, which is incorporated herein by reference. (Cemota is located in Vernaison, France. IP 650 Liftimide is distributed in the United States by IFP Enterprises, Inc., New York, N.Y.) After it has been cured, IP 650 Liftimide film is easily removed by dissolution in commonly used organic solvents. At room temperature IP 650 Liftimide has a high dissolution rate in non-toxic, low boiling organic solvents such as acetone and methyl ethyl ketone.

Figure 1C:
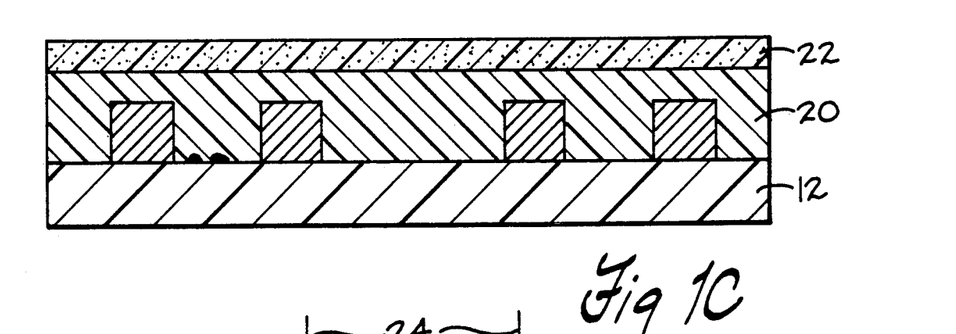

With reference now to FIG. 1C, a catalyst film 22 which can initiate electroless deposition is deposited on protective layer 20. This is done by depositing a catalyst solution on protective layer 20 and then drying the catalyst solution to form catalyst film 22. The catalyst solution may contain a complexed polymer with dissolved seed metal ions which can initiate electroless deposition. Suitable polymers include poly(acrylic acids) and polyacrylamids including alkylated (methyl and butyl) acrylic acid and acrylamide; suitable seed metals include palladium, platinum, gold, rhodium, and any mixture thereof. The catalyst solution can be applied by numerous techniques, such as dip coating, spray coating, spin coating or plasma deposition. In any case, the catalyst solution is dried in an oven at 90° C. for 15 minutes to form the residual solidified catalyst film 22 approximately 2–3 microns thick. Alternatively, if desired, catalyst film 22 can be formed in two-steps (not shown) as follows: first, a solution of a complexing material which can complex with seed metal ions such as a thin polymer layer (such as 1 millimeter of 1% by weight aqueous poly(acrylic acids)) is coated onto protective layer 20 and dried. Second, the coated polymer is contacted with a liquid solution containing seed metal ions to form the catalyst film 22. Further details about coating a polymer layer and a noble metal compound on a substrate to initiate electroless deposition are disclosed in U.S. Pat. No. 4,701,351 to Jackson which is incorporated herein by reference.

Figure 1D:
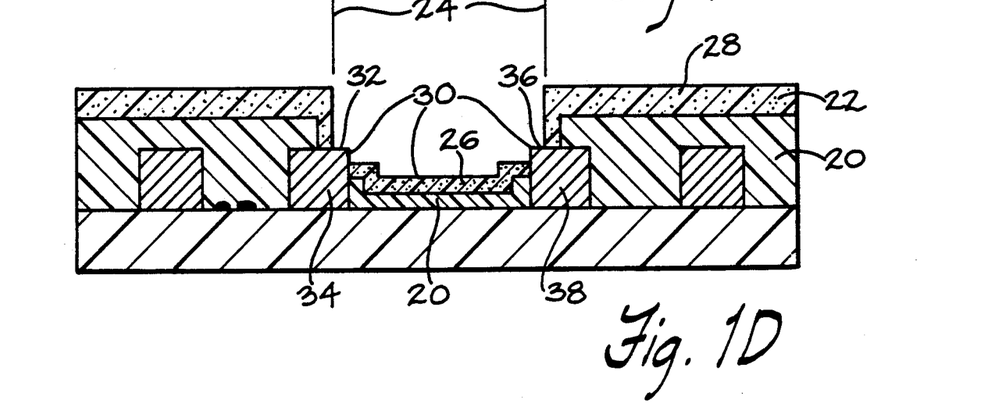

Referring now to FIG. 1D, a laser beam 24 is directed at substrate 10 to irradiate catalyst film 22 with localized heating in a predetermined pattern. This causes the irradiated catalyst film 26 to etch at a slower rate than the non-irradiated catalyst 28 during a subsequent wet chemical etch in order to subsequently allow electrolessly deposited metal to assume the predetermined pattern as shall be described. The laser parameters are also chosen so that protective layer 20 is physically "punched-through" in areas where electrolessly deposited metal is intended to make contact to pre-patterned metal pads 14 on substrate 10. The preferred energy source is a stationary continuous wave argon laser, although several other suitable energy sources include a frequency doubled Nd:YAG, krypton, or dye lasers. Conceivably particle beams or electron beams could be used as well. Returning to the example, a continuous wave argon laser 24 in the all lines mode is used with 0.085 Watts beam power incident on substrate 10, focused to form a stationary gaussian-profile localized heating spot 30 for a duration of 15 milliseconds with 1/(e-squared) radius of approximately 20–25 microns. Heating spot 30 includes portion 32 of pad 34, portion 36 of pad 38, and irradiated catalyst film 26 between pads 34 and 38. Preferably, the irradiated catalyst 26 forms a continuous path between pad portions 32 and 36. As may be seen, heating spot 30 causes the irradiated catalyst 26 and underlying protective layer 20 to decompose and become thinner. As a result, catalyst film 22 is punched-through and physically removed from pad portions 32 and 36 which become exposed. Advantageously, the present invention removes the protective layer from portions of the pads during the laser irradiation step rather than requiring an additional etch step after irradiation as is conventional.

Figure 1E:
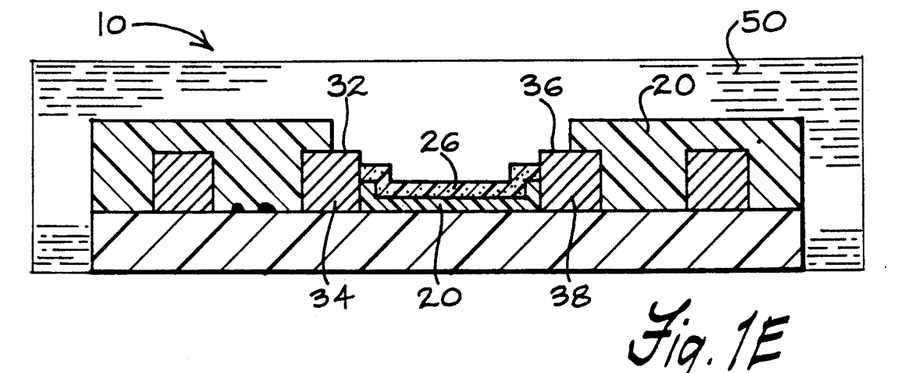

With reference now to FIG. 1E, substrate 10 is placed in a conventional wet chemical etch 50 that etches the non-irradiated catalyst film 28 without etching the irradiated catalyst film 26, protective layer 20, or exposed pad portions 32 and 36. That is, etch 50 dissolves the non-irradiated catalyst film 28 extremely quickly relative to the irradiated catalyst film 26, protective layer 20 and exposed pad portions 32 and 36. Substrate 10 is etched until all of the non-irradiated catalyst 28 is removed while little or none of the irradiated catalyst 26, protective layer 20 and exposed pad portions 32 and 36 are removed from substrate 10. This may be accomplished by immersing substrate 10 in 1M NaOH (sodium hydroxide) for a time appropriate to the thickness of catalyst film 22, for instance 2 minutes for a 1.5 micron thick film. Another suitable etchant is KOH (potassium hydroxide).

Figure 1F:
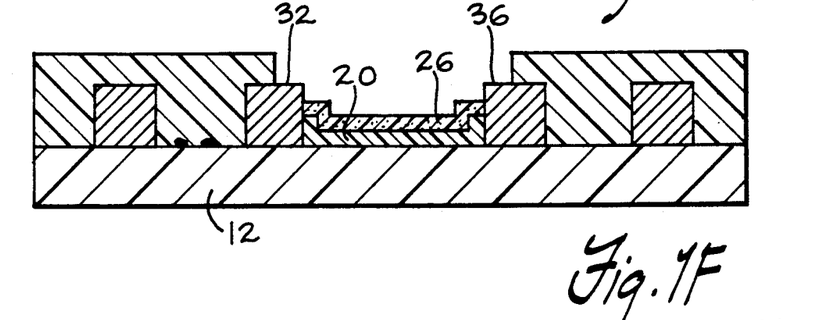

Referring now to FIG. 1F, substrate 10 is removed from the wet chemical etch 50 after all the non-irradiated catalyst film 28 is removed from substrate 10. Preferably substrate 10 is then rinsed with deionized water for 30 seconds.

Figure 1G:
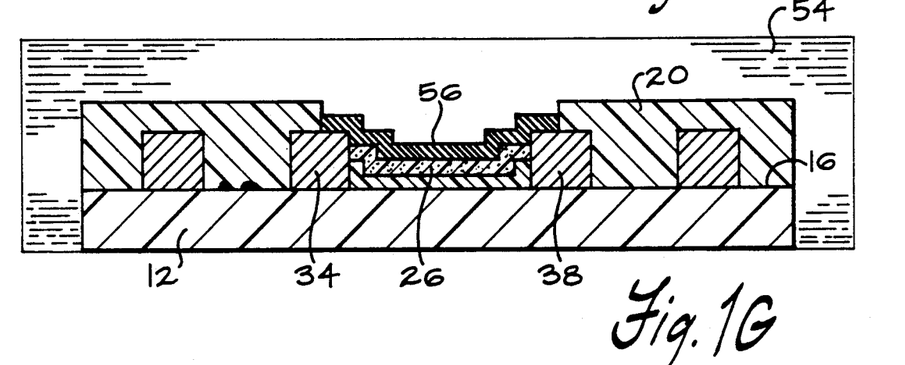

With reference now to FIG. 1G, substrate 10 is placed in a conventional electroless plating bath 54 so that an electrically conductive metal 56 is deposited on the irradiated catalyst film 26 and pads portions 32 and 36, without being deposited on protective layer 20 or dielectric 12, and without plating bath 54 removing protective layer 20 from dielectric surface 16. While copper is the preferred metal 56 to be plated, other suitable metals include nickel and gold. For instance, a "PCK 570" (trademark) electroless copper plating bath can be heated to an appropriate temperature and agitated by mechanical stirring with an immersion time of at least 30 minutes. As may be seen, metal 56 is deposited on exposed pad portions 32 and 36 and irradiated catalyst film 26 therebetween. As a result, metal 56 forms an electrical link between pads 34 and 38.

Figure 1H:
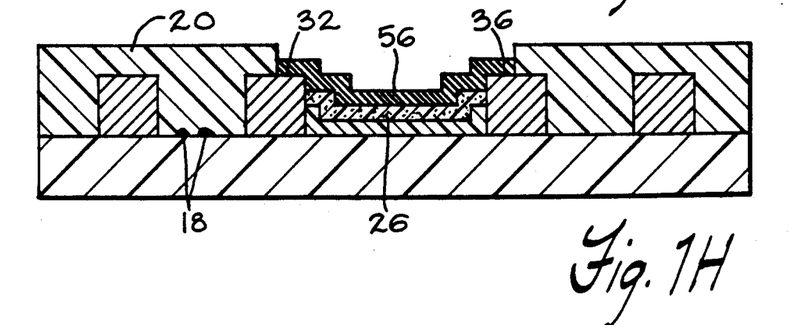

Referring now to FIG. 1H, substrate 10 is removed from electroless plating bath 54. The only metal 56 which adheres to substrate 10 is formed in the predetermined pattern on the irradiated catalyst film 26 and pad portions 32 and 36. No metal 56 is plated on protective layer 20 or unwanted catalytic sites 18. Thus, protective layer 20 has prevented metal 56 from being deposited on substrate 10 outside the predetermined pattern. Furthermore, protective layer 20 has prevented plating bath 54 from attacking the underlying materials outside the predetermined pattern.

Figure 1I:
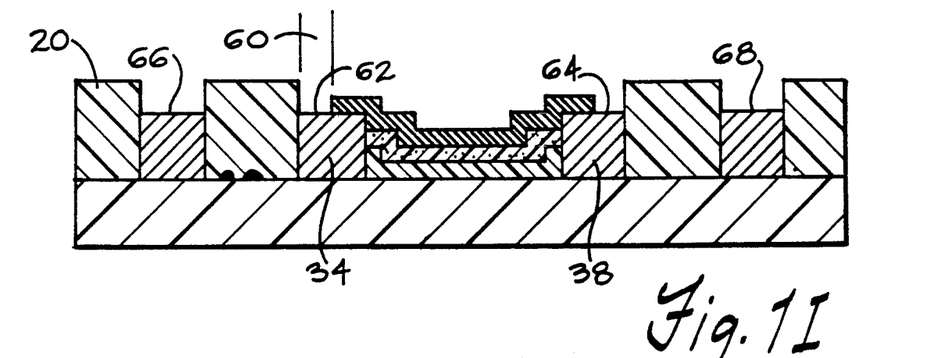

Referring now to FIG. 1I, as an optional step, a second laser beam 60 is directed, separately and in sequence, at second top surface portions 62 and 64 of pads 34 and 38, respectively, and at the top surfaces of pads 66 and 68 in order to expose the entire tops of the pads in the event protective layer 20 is not stripped. In other words, both plated and non-plated pads 14 should have the directly overlaying protective layer removed in order to be fully exposed for bonding operations. For ease of illustration, beam 60 is seen as irradiating and exposing portion 62 of pad 34 after irradiating and exposing portion 64 of pad 38 and the tops of pads 66 and 68. Preferably, second portions 62 and 64 encompass the remaining top surface regions of pads 34 and 38 beyond first portions 32 and 36, respectively. Likewise, preferably pads 66 and 68 have their top surfaces fully exposed.

Figure 1J:
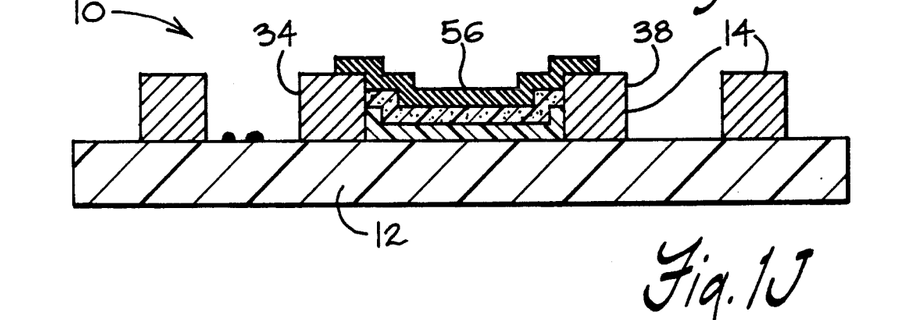

With reference now to FIG. 1J, as another optional step, protective layer 20 is stripped from substrate 10 without removing or damaging pads 14 or metal 56. Protective layer 20 may be stripped by a suitable dry etch or wet chemical etch. A protective layer of IP 650 Liftimide polyimide is best stripped by exposure to acetone for 2-4 minutes. Other suitable organic solvent etchants include ketones such as 7-butyrolactone and methylethylketone, and more powerful solvents such as phenol, m-cresol, dimethylsulfoxide, and N-methyl-2-pyrrolidone (NMP). Obviously, stripping protective layer 20 obviates the need for using laser beam 60 to expose second portions of pads 34 and 38 as described in FIG. 1I. Normally, it would be preferred to strip protective layer 20. While protective layer 20 can provide a permanent protective conformal coating, several problems might arise. Protective layer 20 might introduce stress on substrate 10, although such stress could be reduced or eliminated by matching the thermal coefficients of expansion (TCE) between protective layer 20 and dielectric 12, for instance by using the same material for each. Further, a polyimide dielectric 12 is likely to have high water absorption. The entrapped water may degrade the polyimide's electrical performance and/or corrode the pads.

Figure 1K:
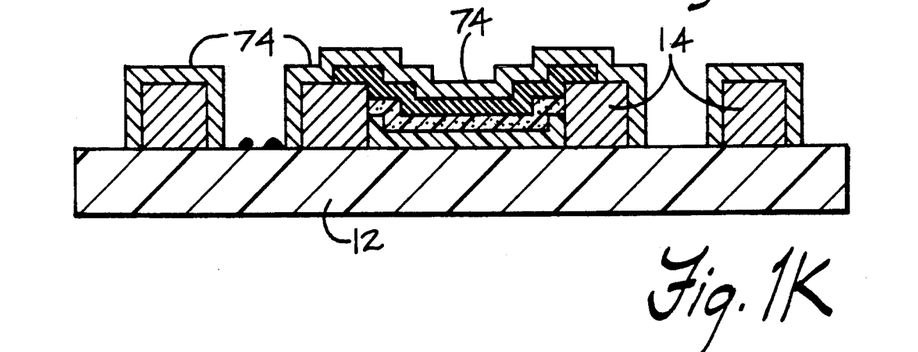

Referring now to FIG. 1K, in a further optional step, a bonding metal 74 is immersion coated on pads 14 to further facilitate subsequent bonding operations to pads 14. For example, gold pads covered with electrolessly deposited copper can be immersion coated with gold. FIG. 1K depicts immersion coating of pads 14 after stripping protective layer 20 as described in FIG. 1J. However, it is understood that pads 14 in FIG. 1I could similarly be immersion coated. More particularly, by applying the immersion coating through the vias in protective layer 20 formed by laser beam 60, bonding metal 74 could be deposited on pads 66 and 68, on the second portions 62 and 64 of pads 34 and 38, respectively, and on metal 56 on the first portions 32 and 36 of pads 34 and 38, respectively.

FIGS. 2A-2L show successive cross-sectional views of fabricating substrate 10a in accordance with a second embodiment of the present invention where like parts are similarly numbered with the addition of the suffix "a". Unless otherwise specified, the second embodiment is identical to the first embodiment in FIGS. 1A-1K.

Figure 2A:
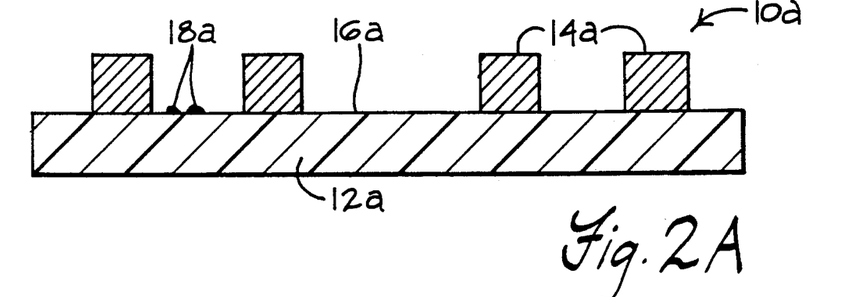
FIGS. 2A, 2B, 2C, 2D, 2E, 2F, 2G, 2H, 2I, 2J, 2K and 2L are successive cross-sectional views of another embodiment of using a protective layer to prevent unwanted electroless deposition on a dielectric.
Figure 2B:
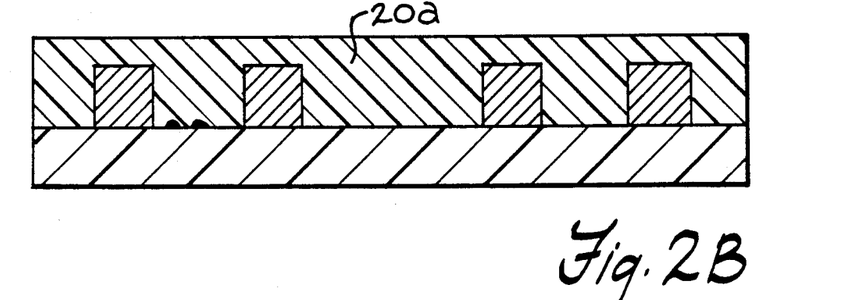

With reference now to FIGS. 2A-2B, in FIG. 2A a dielectric substrate 10a with pads 14a extending above surface 16a of dielectric 12a with unwanted catalytic sites 18a on surface 16a is provided; and in FIG. 2B a protective layer 20a is coated on substrate 10a and is solidified.

Figure 2C:
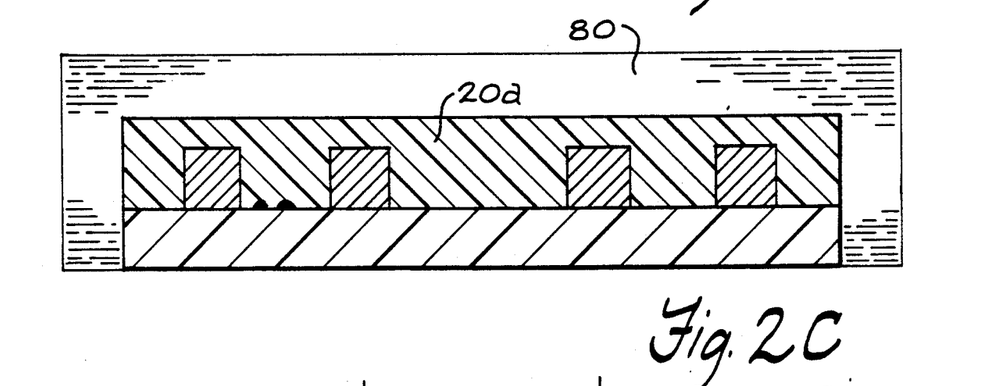

Referring now to FIG. 2C, substrate 10a and in particular protective layer 20a are immersed in a solution 80 containing a complexing material 82 which can complex with seed metal ions, as previously described. But unlike the first embodiment, no seed metal ions are in solution 80 or otherwise complexed with complexing material 82 prior to irradiation.

Figure 2D:
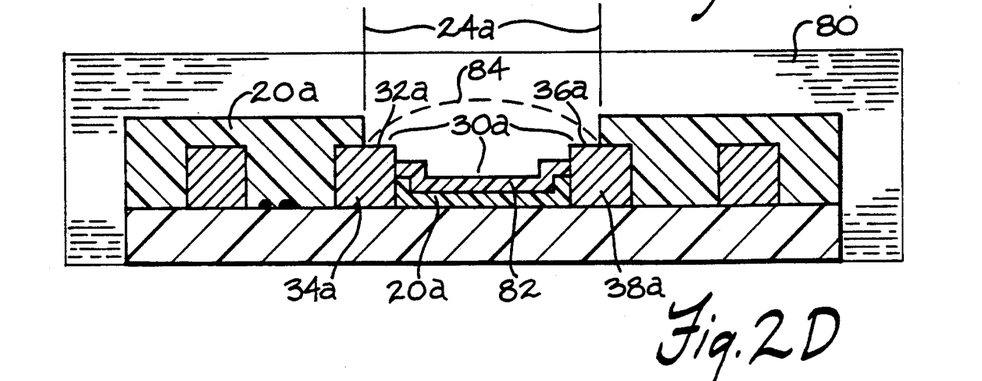

With reference now to FIG. 2D, a laser beam 24a is directed in a predetermined pattern at the immersed protective layer 20a. At the irradiated local heating spot 30a bubble 84 is generated in solution 80. Complexing material 82 is deposited in a thin film on protective layer 20a only where the localized heating and subsequent bubble 84 occur. Furthermore, as previously described, protective layer 20a is decomposed and physically punched-through between pads 34a and 38a by laser beam 24a. As a result, protective layer 20a is pushed off and removed from pad portions 32a and 36a which become exposed.

Figures 2E, 2F, 2G:
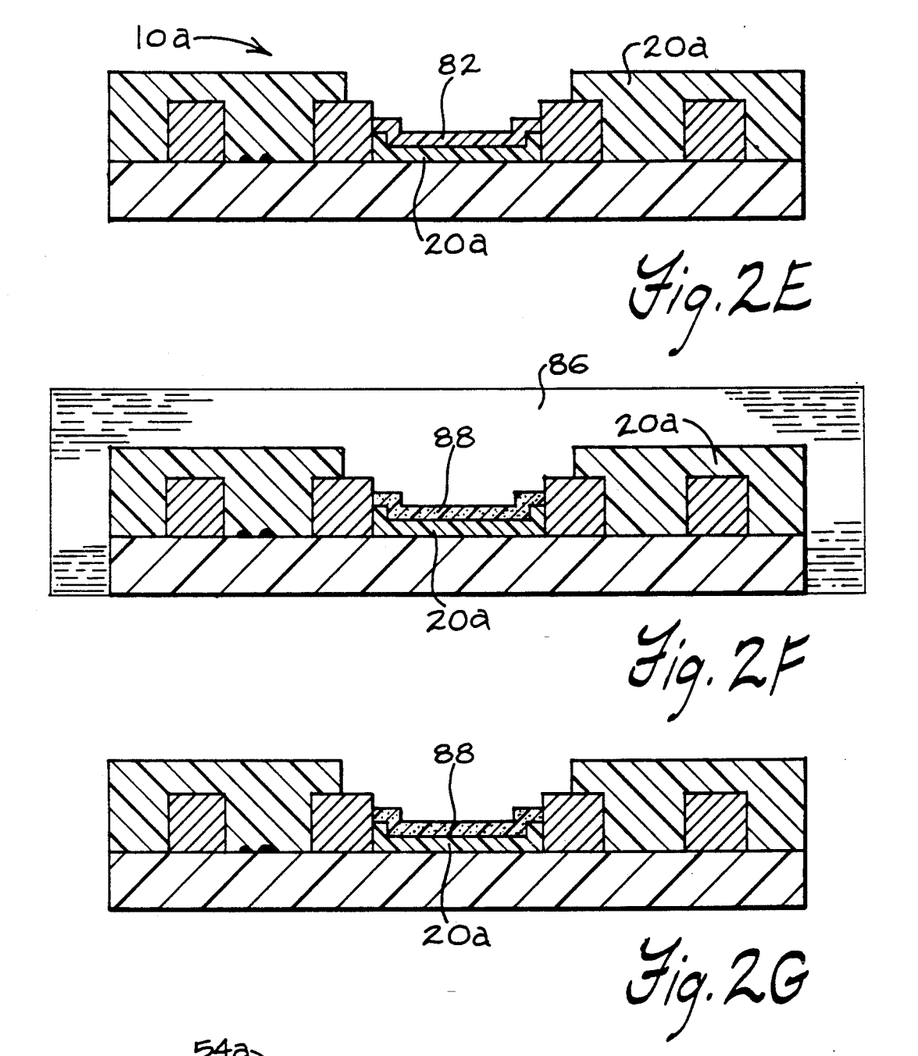

Referring now to FIG. 2E, substrate 10a is removed from solution 80 and cleaned so that the complexing material 82 which remains on substrate 10a assumes the predetermined pattern. The residual solution 80 may be removed, for instance, by rinsing with deionized water for 30 seconds.

Referring now to FIG. 2F, substrate 10a is placed in a solution 86 containing seed metal ions so that the deposited complexing material 82 becomes a catalyst film 88 which can initiate electroless deposition.

With reference now to FIG. 2G, substrate 10a is removed from solution 86 and rinsed in deionized water to remove any residual solution 86.

Figure 2H:
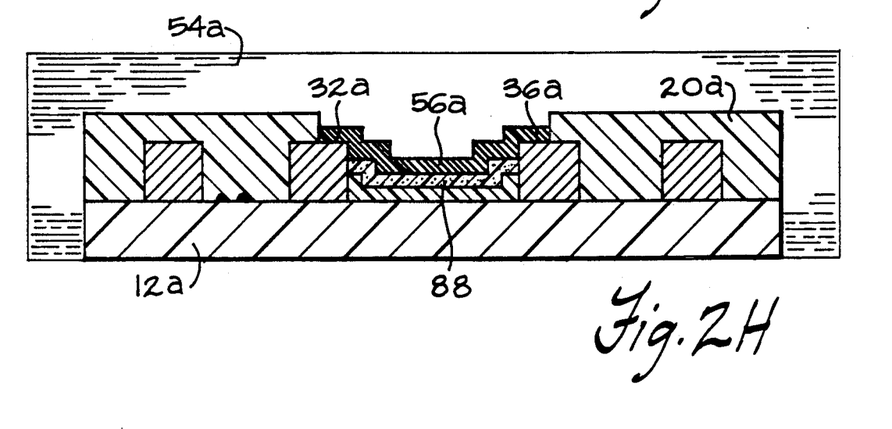

With reference now to FIG. 2H, substrate 10a is placed in an electroless plating bath 54a so that an electrically conductive metal 56a is deposited on the catalyst film 88 and pad portions 32a and 36a, without metal 56a being deposited on protective layer 20a or dielectric 12a, and without the plating bath 54a removing protective layer 20a from dielectric 12a.

Figure 2I:
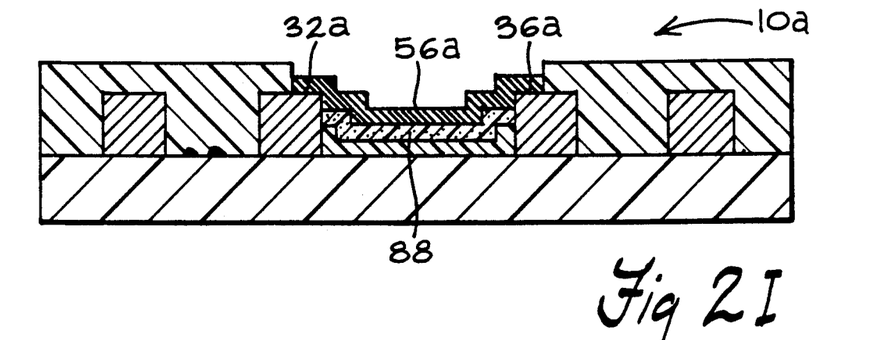

Referring now to FIG. 2I, substrate 10a is removed from electroless plating bath 54a. The only metal 56a that adheres to substrate 10a is formed in the predetermined pattern on catalyst film 88 and exposed pad portions 32a and 36a.

Figure 2J:
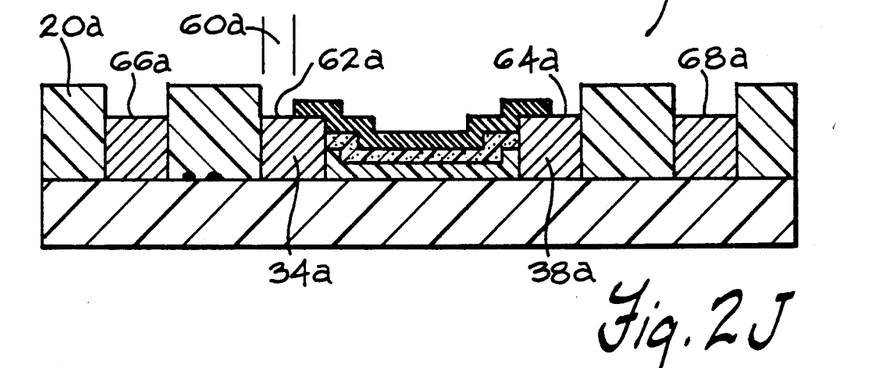
Figure 2K:
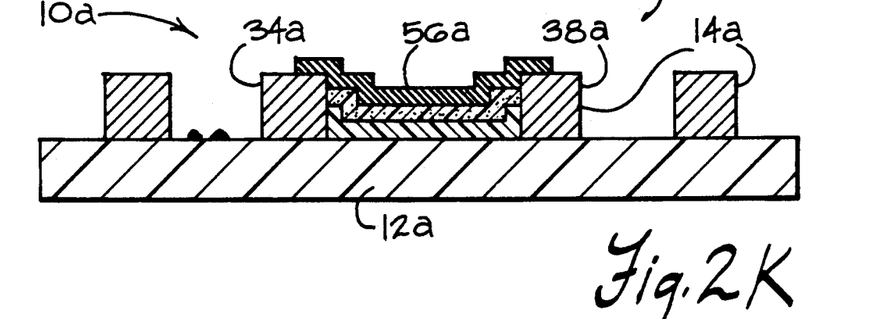
Figure 2L:
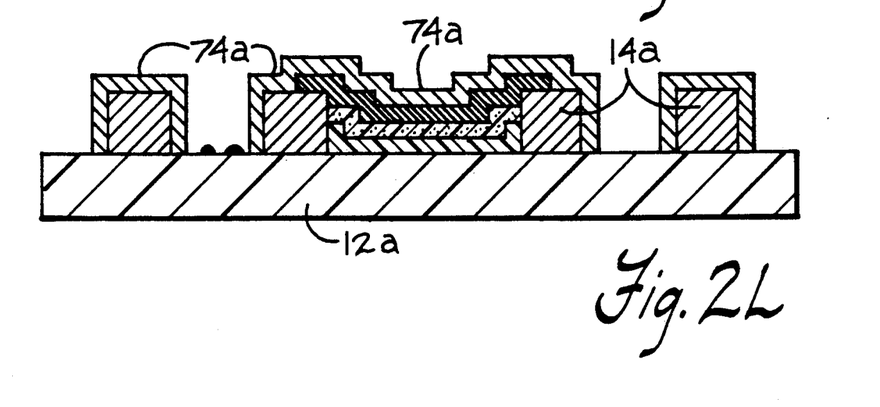

Thereafter, if desired, the steps in FIGS. 2J, 2K and 2L can be performed as described for FIGS. 1I, 1J and 1K, respectively.

EXPERIMENTS PERFORMED

Experiments were performed using conventional photoresist as the protective layer. The resist film was 2 to 3 microns thick. It was found that the selectivity of plating was inadequate. Copper plated between many adjacent laser-irradiated areas, and also plated on top of the resist in regions that were not laser-irradiated. The resist was removed (with some difficulty) after plating with a special stripping solution, but areas with copper plating on the resist were not removed.

Experiments were also performed using commercial polyurethane varnishes as the protective layer. It was found that while this material could work well, it was nearly impossible to strip with a simple wet chemical etch after the metal was plated.

Experiments were also performed using "Duco" (trademark) cement by "Devcon" (trademark), Inc. and rubber cement as the protective layer. There results were mixed. In a few trials the Duco cement worked well, however, in most trials it failed due to chemical attack by the copper plating bath which allowed copper sheeting to occur on the exposed polyimide. In all trials the Duco cement was easily stripped with acetone. The rubber cement was not only etched by the copper plating bath but also difficult to strip.

Experiments were also performed with "Lite-Mask" (trademark) by "Loctite" (trademark) as the protective layer. Lite-Mask is a UV-curable material used on printed-circuit boards as a protective film during soldering operations; see "Lite-Mask Coating Preliminary Technical Data Sheet" by Loctite, May 1989, p.1. It was found that after curing the Lite-Mask was chemically attacked by the copper plating bath. Furthermore, the Lite-Mask was very difficult to strip with wet chemical solvents.

Experiments were also performed with the IP 650 Liftimide polyimide as the protective film. Liftimide is a recently developed polyimide that is soluble in acetone after it has been cured (an unusual property for a polyimide). It was found that when the Liftimide was applied in two layers, each approximately 1 micron thick, and cured according to the manufacturer's instructions, the Liftimide worked well and repeatably as a protective layer. No copper sheeting occurred on the Liftimide and after plating was completed the Liftimide was easily stripped by a brief ultrasonic cleaning in acetone. The laser patterned, electrolessly deposited copper links had electrical resistances comparable to similar links formed without any protective layer. It was also found that the Liftimide frequently peeled from some pre-existing metal pads during electroless deposition but never peeled from the underlying polyimide. Since polyimide was the critical surface as far as unwanted copper sheeting was concerned, limited peeling from the metal pads was considered acceptable.

Figure 3A:
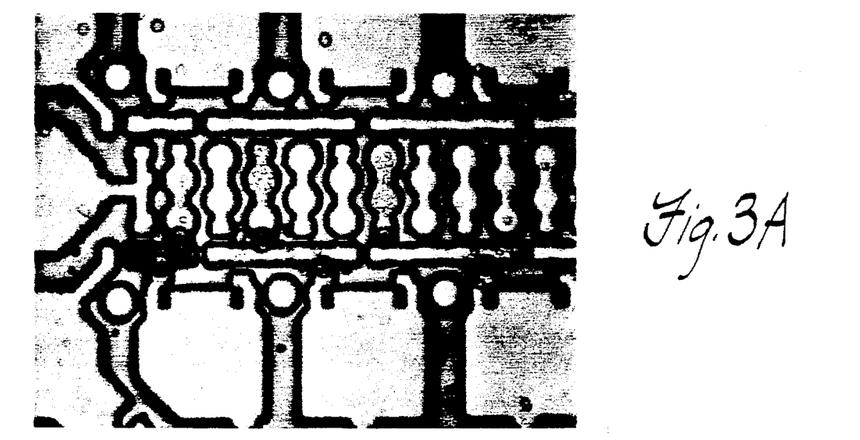
FIGS. 3A, 3B and 3C are photomicrographs of an article formed by practice of the present invention which correspond to a top plan view of FIG. 1D.
Figure 3B:
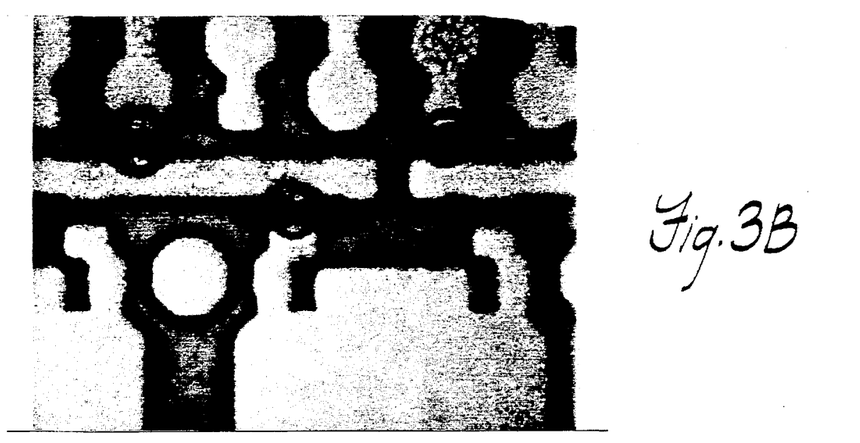
Figure 3C:
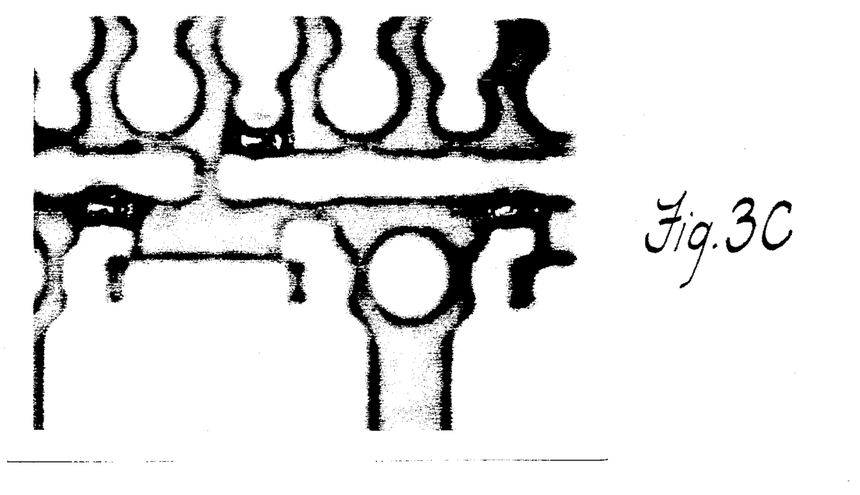

FIGS. 3A-3C are photomicrographs of an article formed in accordance with the method of the present invention which correspond to a top plan view of FIG. 1D. More particularly, FIGS. 3A-3C are photographs taken with an optical microscope showing laser-written catalytic "spots" on a polyimide substrate having gold pads with a protective layer and catalyst film in place.

FIG. 3A shows a 160× magnification of several laserwritten spots between various gold pads. The palladium on the spots has a different appearance than the pads or the dielectric.

FIG. 3B shows a 400× magnification of several spots in FIG. 3A with focus at the top of the pads. Palladium appears on the edges of the pads where the laser beam irradiated and removed the catalyst and protective films that covered these edges. (Note the edges correspond to exposed pad portions 32 and 36 in FIG. 1D.)

FIG. 3C shows another 400× magnification of several spots in FIG. 3A with focus at the bottom of the spots between the pads. Palladium appears in the region between the pads where the laser beam irradiated a continuous path of catalyst film between the pads. (Note the region corresponds to irradiated catalyst film 26 between pads 34 and 38 in FIG. 1D.)

It should also be noted that Applicant completed the method of the present invention on the substrate shown in FIGS. 3A-3C by electrolessly plating copper on the spots to form low-resistance electrical links between the pads. No sheeting was observed.

Other such possibilities should readily suggest themselves to persons skilled in the art. For example, the present invention is well suited for dielectric surfaces without any metal features thereon.

The present invention is therefore well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A process for the selective deposition of a metal on a substrate comprising the following steps in the sequence set forth:

(a) providing a substrate with a top dielectric surface;
(b) coating the substrate with a protective layer;
(c) coating the protective layer with a catalyst film which can initiate electroless deposition;
(d) directing a laser beam at the substrate to irradiate the catalyst film in a pattern;
(e) placing the substrate in a wet chemical etch that etches the non-irradiated catalyst film without etching the irradiated catalyst film or the protective layer;
(f) removing the substrate from the wet chemical etch after all the non-irradiated catalyst film is removed from the substrate;
(g) placing the substrate in an electroless plating bath so that an electrically conductive metal is deposited on the irradiated catalyst film without depositing the metal on the protective layer or the dielectric and without removing the protective layer from the dielectric; and
(h) removing the substrate from the electroless plating bath wherein the only metal which adheres to the protective layer is formed in the pattern on the irradiated catalyst film.

2. The process in claim 1 wherein prior to step (a) the substrate is cleaned.

3. The process in claim 1 wherein the dielectric is a polymer.

4. The process in claim 1 wherein step (b) comprises depositing a solution containing the protective layer material on the substrate and drying the solution to solidify the protective layer.

5. The process in claim 1 wherein the protective layer is a polymer.

6. The process in claim 5 wherein the polymer is a polyimide.

7. The process in claim 6 wherein the polyimide is removable by dissolution in an organic solvent.

8. The process in claim 1 wherein step (c) comprises depositing the catalyst solution on the protective layer and drying the catalyst solution to form the catalyst film.

9. The process in claim 8 wherein the catalyst solution contains a complexed polymer with dissolved seed metal ions which can initiate electroless deposition.

10. The process in claim 9 wherein the polymer is selected from the group consisting of poly(acrylic acids) and polyacrylamids.

11. The process in claim 9 wherein the seed metal ions are selected from the group consisting of palladium, platinum, gold, rhodium and any mixture thereof.

12. The process in claim 1 wherein the wet chemical etch uses an etchant selected from the group consisting of KOH and NaOH.

13. The process in claim 1 wherein metal is selected from the group consisting of copper, nickel and gold.

14. The process in claim 1 wherein the protective layer becomes a permanent part of the substrate.

15. The process in claim 14 wherein the thermal coefficient of expansion of the protective layer is the same as that of the dielectric.

16. The process in claim 15 wherein the protective layer and the dielectric are the same material.

17. The process in claim 1, further comprising
(i) stripping the protective layer from the substrate without removing the metal or the dielectric from the substrate.

18. The process in claim 17 wherein the protective layer is stripped by dry etching.

19. The process in claim 17 wherein the protective layer is stripped by wet chemical etching.

20. The process in claim 19 wherein the wet chemical etch is performed by a solvent selected from the group consisting of acetone, γ-butyrolactone, methylethylketone, phenol, m-cresol, dimethylsulfoxide, and N-methyl-2-pyrrolidone.

21. The process in claim 1, wherein
the substrate comprises a pair of metal bonding pads which extend above the top surface of the dielectric,
the pattern includes portions of the pads and catalyst film between the pads,
the laser beam physically removes the protective layer and catalyst film from the portions of the pads to expose the portions of the pads,
the wet chemical etch fails to etch the exposed portions of the pads, and
the metal is deposited on the exposed portions of the pads and forms an electrical link therebetween.

22. The process in claim 21 wherein the laser is a stationary beam and the pattern includes a continuous path of catalyst film between the exposed portions of the pads.

23. The process in claim 21, further comprising
(i) directing a second laser beam at the pads to remove the protective layer from second portions of the pads.

24. The process in claim 21, further comprising
(i) immersion coating a bonding metal on the pads.

25. The process in claim 24 wherein the pads and bonding metal are gold and the metal is copper.

26. A process for the selective deposition of a metal on a substrate comprising the following steps in the sequence set forth:
(a) providing a substrate with a top dielectric surface;
(b) coating the substrate with a protective layer;
(c) immersing the substrate in a solution of a complexing material which can complex with seed metal ions which can initiate electroless deposition;
(d) directing a laser beam at the protective layer in a pattern so that complexing material from the solution is deposited in the pattern on the irradiated protective layer;
(e) removing the substrate from the solution of complexing material and chemical all non-deposited complexing material off the substrate so that the deposited complexing material on the protective layer forms the pattern;
(f) placing the substrate in a solution containing seed metal ions so that the deposited complexing material becomes a catalyst film which can initiate electroless deposition;
(g) removing the substrate from the solution containing seed metal ions and cleaning any residual solution containing seed metal ions off the substrate;
(h) placing the substrate in an electroless plating bath so that an electrically conductive metal is deposited on the catalyst film without being deposited on the protective layer or the dielectric and without the plating bath removing the protective layer from the dielectric; and
(i) removing the substrate from the electroless plating bath wherein the only metal which adheres to the dielectric is formed in the pattern on the catalyst film.

27. The process in claim 26 wherein prior to step (a) the substrate is cleaned.

28. The process in claim 26 wherein the dielectric is a polymer.

29. The process in claim 26 wherein step (b) comprises depositing a solution containing the protective layer material on the substrate and drying the solution to solidify the protective layer.

30. The process in claim 26 wherein the protective layer is a polymer.

31. The process in claim 30 wherein the polymer is a polyimide.

32. The process in claim 31 wherein the polyimide is removable by dissolution in an organic solvent.

33. The process in claim 26 wherein the complexing material is a polymer.

34. The process in claim 33 wherein the polymer is selected from the group consisting of poly(acrylic acids) and polyacrylamids.

35. The process in claim 26 wherein the seed metal ions are selected from the group consisting of palladium, platinum, gold, rhodium and any mixture thereof.

36. The process in claim 26 wherein metal is selected from the group consisting of copper, nickel and gold.

37. The process in claim 26 wherein the protective layer becomes a permanent part of the substrate.

38. The process in claim 37 wherein the thermal coefficient of expansion of the protective layer is the same as that of the dielectric.

39. The process in claim 38 wherein the protective layer and the dielectric are the same material.

40. The process in claim 26, further comprising
   (j) stripping the protective layer from the substrate without removing the metal or the dielectric from the substrate.

41. The process in claim 40 wherein the protective layer is stripped by dry etching.

42. The process in claim 40 wherein the protective layer is stripped by wet chemical etching.

43. The process in claim 42 wherein the wet chemical etch is performed by a solvent selected from the group consisting of acetone, $\gamma$-butyrolactone, methylethylketone, phenol, m-cresol, dimethylsulfoxide, and N-methyl-2-pyrrolidone.

44. The process in claim 26, wherein
   the substrate comprises a pair of metal bonding pads which extend above the top surface of the dielectric;
   the pattern includes portions of the pads and catalyst film between the pads,
   the laser beam physically removes the protective layer and catalyst film from the portions of the pads to expose the portions of the pads, and
   the metal is deposited on the exposed portions of the pads and forms an electrical link therebetween.

45. The process in claim 44 wherein the laser is a stationary beam and the pattern includes a continuous path of catalyst film between the exposed portions of the pads.

46. The process in claim 44, further comprising
   (j) directing a second laser beam at the pads to remove the protective layer from second portions of the pads.

47. The process in claim 44, further comprising
   (j) immersion coating a bonding metal on the pads.

48. The process in claim 47 wherein the pads and bonding metal are gold and the metal is copper.

* * * * *